(12) United States Patent
Robert

(10) Patent No.: US 7,444,873 B2
(45) Date of Patent: Nov. 4, 2008

(54) MICROMACHINED COMB CAPACITIVE ACCELEROMETER

(75) Inventor: Philippe Robert, Grenoble (FR)

(73) Assignee: Commissariat A l'Energie Atomique, Paris (FR)

( * ) Notice: Subject to any disclaimer, the term of this patent is extended or adjusted under 35 U.S.C. 154(b) by 162 days.

(21) Appl. No.: 11/305,200

(22) Filed: Dec. 19, 2005

(65) Prior Publication Data

US 2007/0012110 A1 Jan. 18, 2007

(30) Foreign Application Priority Data

Dec. 29, 2004 (FR) .................... 04 14033

(51) Int. Cl.
*G01P 15/125* (2006.01)
(52) U.S. Cl. ..................... 73/514.32; 438/50
(58) Field of Classification Search .............. 73/514.32; 361/280
See application file for complete search history.

(56) References Cited

U.S. PATENT DOCUMENTS 4,653,326 A   3/1987   Danel et al.

6,105,428 A  *  8/2000   Schmiesing et al. ...... 73/514.32

FOREIGN PATENT DOCUMENTS

| DE | 199 28 291 A 1 | 12/1999 |
|---|---|---|
| FR | 2 558 263 B1 | 7/1985 |
| JP | 10-2911 | 1/1998 |

* cited by examiner

*Primary Examiner*—John E Chapman
(74) *Attorney, Agent, or Firm*—Oblon, Spivak, McClelland, Maier & Neustadt, P.C.

(57) ABSTRACT

A comb capacitive accelerometer comprising a substrate, a mobile electrode relative to said substrate fitted with a plurality of mobile fingers, an electrode fixed relative to said substrate fitted with a plurality of fixed fingers, each of said mobile fingers being positioned between two contiguous fixed fingers so as to form a microstructure with interdigital combs. According to the invention the mobile fingers are connected to one another by at least a first connecting beam etched directly into the substrate, and/or the fixed fingers are connected to one another by at least a second connecting beam etched directly in the substrate.

14 Claims, 3 Drawing Sheets

MICROMACHINED COMB CAPACITIVE ACCELEROMETER

TECHNICAL FIELD

The invention relates to the field of silicon micro-sensors and more specifically concerns a micromachined comb capacitive accelerometer comprising a substrate, a mobile electrode relative to said substrate fitted with an ensemble of sensitive mobile fingers, a fixed electrode relative to said substrate fitted with an ensemble of fixed sensitive fingers, each of the mobile fingers being positioned between two contiguous fixed fingers so as to form a microstructure with interdigital combs.

STATE OF PRIOR ART

FIG. 1 schematically illustrates a plan view of an accelerometer with interdigital combs of the prior art comprising a first electrode 2 and a second electrode 4 etched in the same silicon substrate 5. The first electrode 2 is constituted by a mobile mass 6 fitted with a plurality of mobile fingers 7 extending laterally. The second electrode is composed of two parts 4A, 4B located on either side of the mobile mass 6 and each comprising several fixed fingers 8 extending parallel to the mobile fingers 7. Each of the mobile fingers 7 are positioned between two contiguous fixed fingers so as to define a microstructure with interdigital combs. The mobile mass 6 is connected to the substrate 5 by a flexible rod 12 defining a return spring.

In operation, under the effect of acceleration according to the axis of the mobile mass 6, the latter is displaced in the plane relative to the substrate 5, causing relative displacement of the mobile fingers 7 relative to the fixed fingers 8. This relative displacement produces a variation in the capacity between the mobile fingers 7 and the fixed fingers 8. The acceleration measurement is realised by the measurement of this variation in capacity.

In general, these micro-accelerometers are made on a layer of polycrystalline silicon deposited on either a sacrificial layer of oxide, or on a SOI-type substrate (Silicon On Insulator for Silicium sur Isolant) comprising a buried layer of oxide then serving as a sacrificial layer. An example of such a microstructure is described in the applicant's French patent No. FR 2558263.

A problem of accelerometers of the prior art described hereinabove originates from the fact that under certain conditions the mobile fingers and the fixed fingers stay stuck to one another, as illustrated in FIG. 1, resulting in a substantial drop in production yield, and to significant risk of malfunction of the accelerometer. This problem could originate with the accumulation of electrical charge on the surfaces of the sensitive fingers and occurs either after a shock, or after the application of a voltage between fixed combs and mobile combs capable of putting the two sets of electrodes in contact.

To solve this problem, a known solution consists of connecting the fingers of the combs by using a thick sacrificial layer on the fingers of the structure and by depositing a layer, not stressed if possible, typically made of polycrystalline Si, to join these fingers together.

This solution is complex because, on the one hand, it is difficult to obtain a thick sacrificial layer, and on the other hand, using a non-stressed layer limits the choice of material and requires a high-temperature process to be utilised.

The aim of the invention is to eliminate the disadvantages of the prior art described hereinabove.

DESCRIPTION OF THE INVENTION

The invention recommends a comb capacitive accelerometer comprising a substrate, a mobile electrode relative to said substrate fitted with an ensemble of mobile fingers, a fixed electrode relative to said substrate fitted with an ensemble of fixed fingers, each of said mobile fingers being positioned between two contiguous fixed fingers so as to form a microstructure with interdigital combs.

According to the present invention, the mobile fingers are connected to one another by at least a first connecting beam etched directly in the substrate, and/or, the fixed fingers are connected to one another by at least a second connecting beam etched directly into the substrate.

Said connecting beams are preferably located in the vicinity of the end of the fingers to be connected.

This disposition helps to increase the rigidity of the ensemble of the mobile fingers and/or the fixed fingers in the zone where the mobile fingers are strongly displaced.

Advantageously, the mobile electrode is connected to the substrate by flexible rods. The flexible rods are preferably attached at the ends of the mobile electrode. Advantageously, these flexible rods are etched directly in the substrate.

In a preferred embodiment, the mobile electrode comprises a mobile mass, preferably rectangular, from which extend laterally said mobile fingers, and the fixed electrode comprises two parts positioned symmetrically on either side of the mobile mass, each comprising fixed fingers extending laterally towards said mobile mass, such that each mobile finger is positioned between two contiguous fixed fingers.

Advantageously, the mobile mass comprises at least one connecting beam etched in the substrate. The effect of the local thickening of the mobile mass is to increase the sensitivity of the accelerometer without increasing its size.

In an advantageous embodiment of the invention the mobile fingers and/or the fixed fingers located at the ends of the mobile mass have a width greater than that of the other mobile and/or fixed fingers. This allows the rigidity of the ensemble of the fingers to be increased, without limiting their number.

The substrate is preferably an SOI substrate.

The accelerometer according to the present invention is made by a process comprising the following stages:
  providing a substrate comprising a buried sacrificial layer,
  forming a mask on a face of the substrate according to a pattern to define a microstructure with interdigital combs comprising a seismic mass, return springs, an ensemble of mobile fingers and an ensemble of fixed fingers arranged such that each mobile finger is positioned between two contiguous fixed fingers,
  etching in the face of the substrate according to the pattern and stopping on the buried sacrificial layer,
  thinning the face of the exposed substrate, stopping before the buried sacrificial layer according to a thickness at least equal to the thickness of at least one connecting beam,
  forming at least a first connecting beam joining the mobile fingers, and/or of the at least a second connecting beam joining the fixed fingers by etching in the face of the exposed substrate stopping on the sacrificial layer,
  forming anchoring points for attaching at least a first connecting beam on at least two mobile fingers, and/or at least a second connecting beam on at least two fixed fingers,
  eliminating at least part of the sacrificial layer to separate the ensemble of mobile fingers from the ensemble of fixed fingers.

It is preferable for there to be at least two anchoring points per connecting-beam.

Advantageously, the thinning is carried out by etching, for example via plasma etching (DRIE), by mixed KOH and DRIE etching, by mechanical thinning.

Eliminating the sacrificial layer is completed advantageously by humid etching or by etching with hydrofluoric acid in the form of steam.

According to a variant, the process also comprises a formation stage of at least one connecting beam on the mobile mass and a formation stage of anchoring points for attaching said at least one connecting beam on the mobile mass.

Advantageously, the formation stage of anchoring points can be completed prior to the formation stage of at least one connecting beam.

The substrate is preferably an SOI substrate, that is, a silicon substrate comprising a buried sacrificial layer of $SiO_2$.

The connecting beams are preferably made of a material selected from SiN, $Si_3N_4$ and polycrystalline silicon.

Advantageously, the formation stage of the anchoring points is completed by arranging holes by etching the exposed face of the substrate and of the subjacent sacrificial layer and by filling these holes with the material of the anchoring points. The anchoring points can be made for example by litho-etching of the upper layer of the substrate and of the sacrificial layer as far as the lower layer of the substrate subjacent to the sacrificial layer.

In accordance with a variant, the manufacturing process additionally comprises the following stages:
  providing a support substrate exhibiting a cavity on one of its faces,
  sealing the face of the substrate comprising the microstructure with interdigital combs on the face of the support substrate vis-à-vis the cavity of said support substrate. The sealing can be done for example by molecular adhesion, eutectic sealing, polymer, etc.

Advantageously, the support substrate is made of silicon or glass. The support substrate serves as mechanical support.

BRIEF DESCRIPTION OF THE FIGURES

Other characteristics and advantages of the invention will emerge from the following description, given by way of non-limiting example, in reference to the appended figures in which.

DETAILED DISCLOSURE OF PARTICULAR EMBODIMENTS

Following the description, the elements common to the devices of the prior art and to the devices of the invention will be designated by identical references numerals.

Figure 1:
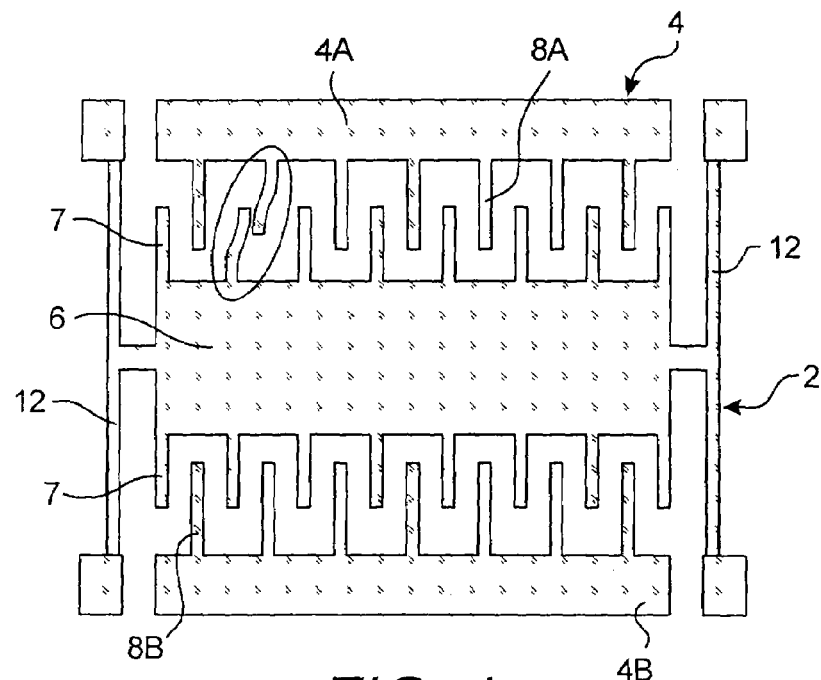
FIG. 1, described previously, schematically illustrates a plan view of an accelerometer of the prior art, FIG. 2 schematically illustrates a plan view of an accelerometer according to the present invention.
Figure 2:
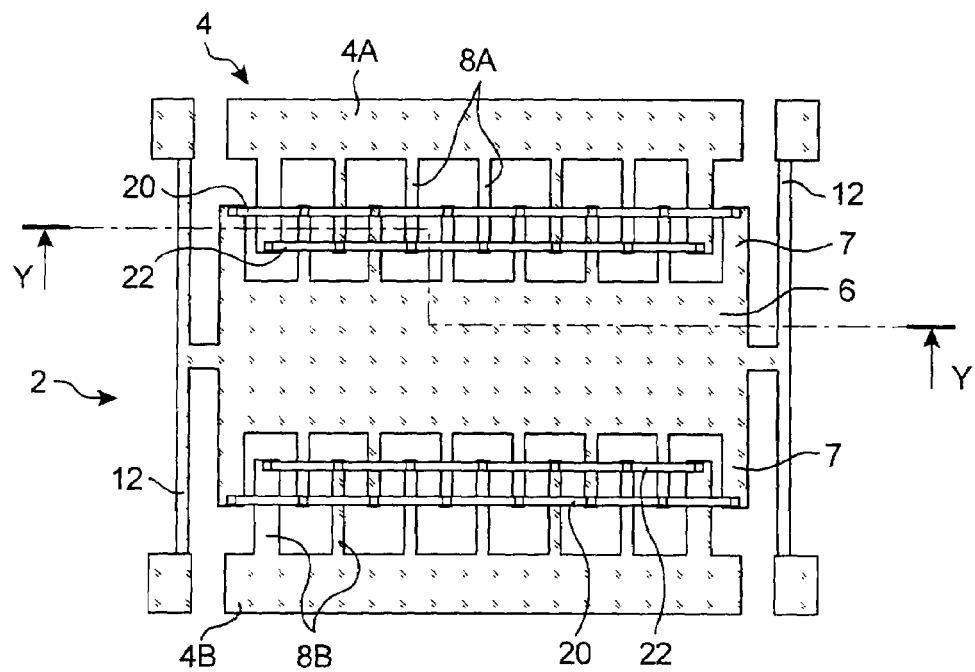

FIG. 2 schematically illustrates a plan view of a micromachined comb capacitive accelerometer produced in a substrate 5 of SOI (Silicon on insulator) type and transferred to a cavity.

This accelerometer comprises a first mobile electrode 2 relative to the substrate 5 and a second electrode (4A, 4B) fixed relative to said substrate 5. The mobile electrode 2 comprises a mobile mass 6 of rectangular shape, etched in the substrate 5 and fitted with an ensemble of sensitive fingers 7 likewise etched in the substrate 5 and extending laterally on each side of the mobile mass 6.

The fixed electrode 4 comprises a first part 4A arranged along one of the sides of the mobile mass 6, and a second part 4B arranged along the other side of the mobile mass 6.

The first part 4A and the second part 4B each comprise several fixed fingers 8A, 8B extending laterally in the direction of the mobile mass 6 and parallel to the mobile fingers 7, such that each mobile finger 7 is positioned between two contiguous fixed fingers 8.

The mobile mass 6 is joined to the fixed electrode (4A, 4B) by means of flexible rods 12 made by etching in the substrate 5.

In the embodiment illustrated by FIG. 2, the mobile fingers 7 are connected to one another by a first connecting beam 20 made by etching in the mass of the substrate (solid part of the substrate). Similarly, the fixed fingers (8A, 8B) are connected to one another by a second connecting beam 22 produced by etching in the mass of the substrate (solid part of the substrate).

The first connecting beam 20 is anchored on each mobile finger 7 and the second connecting beam 22 is anchored on each fixed finger (8A, 8B).

The connecting beams 20, 22 can be anchored by a $Si_3N_4$-type deposit or polycrystalline silicon.

Figure 3:
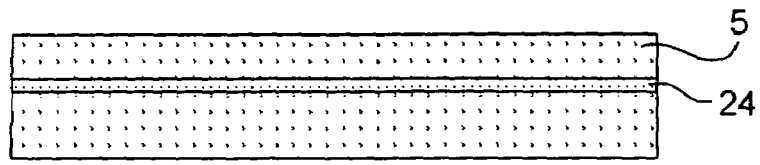
FIGS. 3 to 11 are views in vertical section according to the axis YY of FIG. 2, schematically illustrating the different phases of the manufacturing process of an accelerometer according to the present invention.

The substrate 5 comprises a layer of buried oxide (visible in FIG. 3 showing the substrate 5) which acts as a sacrificial layer to the connecting beams defining, after it is retracted, a recess preventing the connecting beam 20 (respectively 22) of the mobile fingers (respectively fixed) from touching the fixed fingers (respectively mobile).

To effect anchoring of the beams 20 and 22, the etching time of the sacrificial layer 24 can likewise be applied. In effect, if the beams 20 and 22 are clearly narrower than the anchoring zones, during the stage of retraction of the sacrificial layer 24, the former will be freed well before the oxide at the anchoring level disappears.

By way of an embodiment, the connecting beams 20, 22 can have a width of 2 μm and the anchoring zone can have a width of 6 μm per side. This variant allows the depositing stage to be eliminated.

In order to increase the rigidity of the ensemble, the fingers 7 situated at the two ends of the mobile mass 6 are enlarged relative to the other fingers. Also, in a variant embodiment, the thickness of the silicon utilized to make the connecting beams 20, 22 is retained at the level of the mobile mass 6 to locally boost its thickness and thus its mass. This variant helps to increase the sensitivity of the sensor to the extent where the return springs remain unchanged, and only the mass increases.

To ensure proper anchoring of the additional mass on the mobile mass 6, anchoring points (made of $Si_3N_4$ or polycrystalline silicon) are added as for the connecting beams 20, 22.

Another method consists of choosing dimensions of the recovery zone of the mobile mass 6 and a sufficient additional mass, such that all the buried oxide is not eliminated when the sacrificial layer 24 is retracted.

The manufacturing process of the accelerometer according to the present invention will now be described in reference to FIGS. 3 to 11, showing a partial vertical section of the accelerometer shown in FIG. 2, according to the axis YY.

The stage illustrated by FIG. 3 consists of creating a mask on the SOI-type substrate 5 to define on this substrate the seismic mass, the return springs, the anchoring zones, an ensemble of mobile fingers and an ensemble of fixed fingers, arranged such that each mobile finger is positioned between two contiguous fixed fingers. As is evident from this figure, the substrate 5 comprises a buried sacrificial layer of oxide (SiO$_2$) 24.

Figure 4:
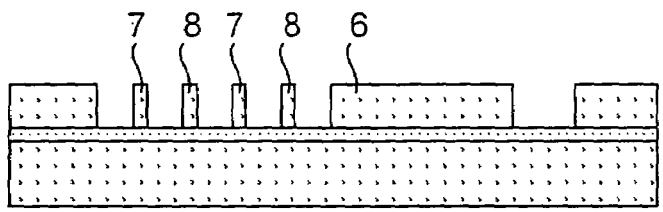

The stage illustrated by FIG. 4 consists of creating the ensemble of mobile fingers and the ensemble of fixed fingers by direct etching of 60 μm in the SOI substrate 5, stopping on the buried layer of oxide (SiO$_2$) 24.

Figure 5:

The stage illustrated by FIG. 5 consists of etching a cavity of 30 μm on a second silicon substrate 26.

Figure 6:
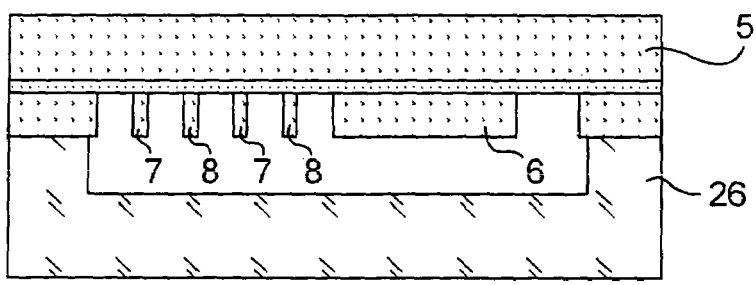

The stage illustrated by FIG. 6 consists of sealing the SOI substrate 5 on the second substrate 26, for example by molecular adhesion, eutectic sealing, polymer, etc.

Figure 7:
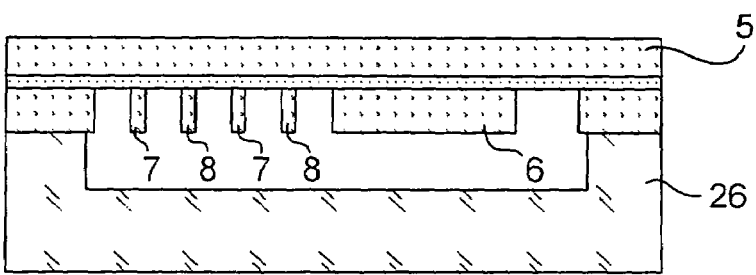

The stage illustrated by FIG. 7 consists of thinning the SOI substrate by etching, for example by plasma etching (DRIE), by mixed KOH and DRIE etching, by mechanical thinning, stopping approximately 10 μm of the buried layer of oxide (SiO$_2$) 24.

Figure 8:
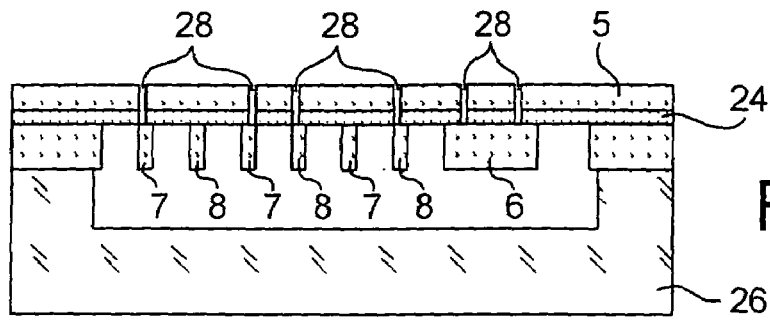

The stage illustrated by FIG. 8 consists of creating, by litho-etching, anchoring points 30 of the connecting beams 20, 22 at 10 μm of the silicon and 0.4 μm of the layer of oxide SiO$_2$ 24 as far as the silicon layer "from below".

Figure 9:
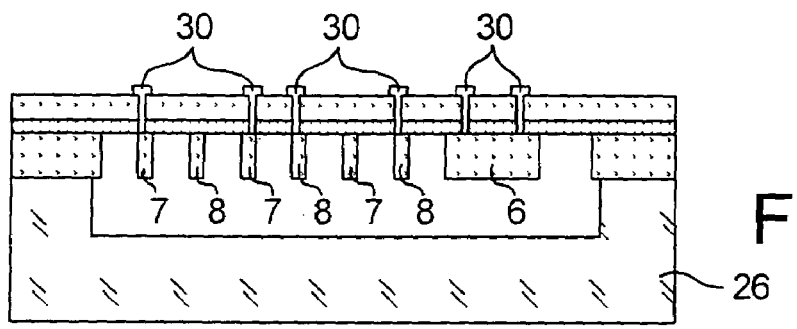

The stage illustrated by FIG. 9 consists of laying down a deposit 30 of around 0.8 μm of SiNo$_4$ and litho-etching the anchoring points of the connecting beam on the fingers 20, 22.

Figure 10:
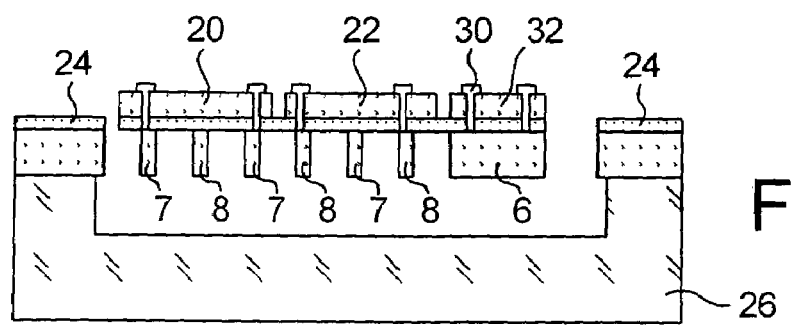

The stage illustrated by FIG. 10 consists of creating the connecting beam 20 joining the mobile fingers 7 and the connecting beam 22 joining the fixed fingers 8, as well as the connecting beam 32 on the mobile mass 6.

Figure 11:
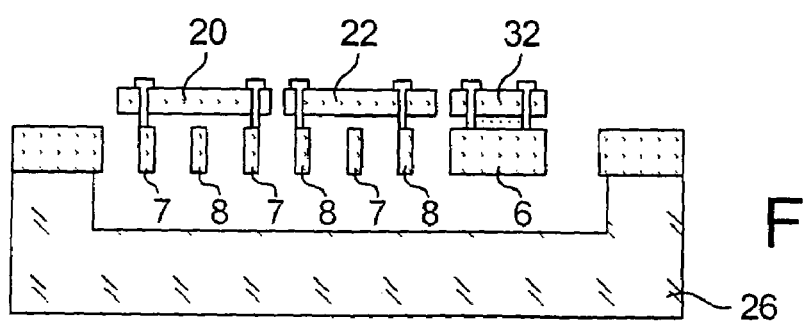

The stage illustrated by FIG. 11 consists of withdrawing the sacrificial layer 24 by humid etching or by HF etching (hydrofluoric acid) steam to separate the ensemble of mobile fingers from the ensemble of fixed fingers.

This process:
eliminates the problem of the interdigital combs sticking,
disposes of the use of a deposited sacrificial layer,
places connecting beams directly in the substrate, thus made of monocrystalline silicon, and thus avoiding mechanical stresses on the combs capable of deforming the fingers.

In addition, with the process according to the present invention, it is possible to locally thicken certain parts of the mobile mass in order to increase sensitivity without increasing the size of the accelerometer.

The invention claimed is:

1. A comb capacitive accelerometer comprising:
a SOI substrate with a first and a second semiconductive layer mechanically separated from one another,
a mobile electrode which is mobile relative to said first layer fitted with a plurality of mobile fingers, and
an electrode fixed relative to said first layer, said first layer being fitted with a plurality of fixed fingers, each of said mobile fingers being positioned between two contiguous fixed fingers so as to form a microstructure in said first layer with interdigital combs, wherein the mobile fingers are connected to one another by at least a first connecting beam etched directly in the second layer, and/or, the fixed fingers are connected to one another by at least a second connecting beam etched directly in the second layer.

2. The accelerometer according to claim 1, wherein said connecting beams are located in proximity with an end of the fingers to be joined.

3. The accelerometer according to claim 1, which comprises a plurality flexible rods wherein the mobile electrode is joined to the substrate by said flexible rods.

4. The accelerometer according to claim 3, wherein said flexible rods are etched directly into the substrate.

5. The accelerometer according to claim 1, wherein the mobile electrode comprises a mobile member, from which extend laterally said mobile fingers, and the fixed electrode comprises two parts positioned symmetrically on either side of the mobile member and each comprising fixed fingers extending laterally towards said mobile member such that each said mobile finger is positioned between two contiguous fixed fingers.

6. The accelerometer according to claim 5, wherein the mobile member comprises at least one connecting beam etched into the substrate.

7. The accelerometer according to claim 6, in which the mobile fingers and/or the fixed fingers located at end portions of the mobile electrode have a width greater than that of other mobile and/or fixed fingers.

8. A manufacturing process of a comb capacitive accelerometer according to claim 7 which comprises:
providing said SOI substrate so as to include a buried sacrificial layer,
forming a mask on a face of the substrate according to a pattern for defining a microstructure with interdigital combs which includes forming a mobile electrode, forming a plurality of return springs, and forming a plurality of mobile fingers and a plurality of fixed fingers arranged such that each said mobile finger is positioned between two contiguous fixed fingers, said mobile electrode, said return spring and said plurality of mobile fingers and fixed finger comprising said microstructure,
etching a face of the substrate according to the pattern formed on the buried sacrificial layer,
forming at least one first connecting beam joining the mobile fingers, and/or at least one second connecting beam joining the fixed fingers by etching the face of the exposed substrate formed on the sacrificial layer,
thinning the face of the exposed substrate and stopping thinning before the buried sacrificial layer has a thickness at least equal to a thickness of said at least one connecting beam,
forming anchoring points for attaching at least said at least are first connecting beam on at least two mobile fingers, and/or said at least are second connecting beam on at least two fixed fingers,
eliminating at least part of said sacrificial layer to separate said plurality of mobile fingers from said plurality of fixed fingers.

9. The manufacturing process according to claim 8, further comprising completing a formation stage of at said least one connecting beam on said mobile member and a formation stage of anchoring points for attaching said at least one connecting beam on the mobile member.

10. The manufacturing process according to claim 8, in which the formation stage of anchoring points is completed prior to the formation stage of at least one connecting beam.

11. The manufacturing process according to claim 8, in which providing of said SOI substrate comprises utilizing a silicon substrate which includes a buried layer of SiO$_2$, said buried layer comprising a sacrificial layer.

12. The manufacturing process according to claim 10, which comprises forming the connecting beams of a material selected from SiN, Si$_3$N$_4$ and polycrystalline silicon.

13. The manufacturing process according to claim 10, in which the formation stage of the anchoring points comprises arranging holes by etching the exposed face of the substrate and the subjacent sacrificial layer and by filling the holes with material of the anchoring points.

14. The manufacturing process according to claim 10, in which the process further comprises the following stages:

providing a support substrate having a cavity formed on one face thereof, and sealing the face of the substrate comprising the microstructure with interdigital combs located on the face of the support substrate vis-à-vis the cavity of said support substrate.

* * * * *